US008153995B2

(12) United States Patent
Hino

(10) Patent No.: US 8,153,995 B2
(45) Date of Patent: Apr. 10, 2012

(54) ION IMPLANTING APPARATUS

(75) Inventor: Masayoshi Hino, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 204 days.

(21) Appl. No.: 12/545,543

(22) Filed: Aug. 21, 2009

(65) Prior Publication Data
US 2010/0084584 A1    Apr. 8, 2010

(30) Foreign Application Priority Data
Oct. 3, 2008    (JP) .................. 2008-258718

(51) Int. Cl.
*H01J 37/22* (2006.01)
*H01J 37/20* (2006.01)

(52) U.S. Cl. ............. 250/492.21; 250/492.1; 250/492.3; 356/237.1

(58) Field of Classification Search .... 250/492.1–492.3, 250/492.21; 356/237.1
See application file for complete search history.

(56) References Cited

U.S. PATENT DOCUMENTS

| | | | | |
|---|---|---|---|---|
| 4,391,522 A | * | 7/1983 | Schmid et al. ................ | 356/326 |
| 5,321,257 A | * | 6/1994 | Danisch .................. | 250/227.16 |
| 5,845,038 A | * | 12/1998 | Lundin et al. ................ | 362/551 |
| 6,633,831 B2 | * | 10/2003 | Nikoonahad et al. ......... | 702/155 |
| 6,848,822 B2 | * | 2/2005 | Ballen et al. .................. | 362/577 |
| 7,250,611 B2 | * | 7/2007 | Aguirre et al. ............. | 250/461.1 |
| 7,268,867 B2 | * | 9/2007 | Vollrath et al. ............. | 356/237.1 |
| 7,361,914 B2 | * | 4/2008 | Rathmell et al. ......... | 250/492.21 |
| 7,435,951 B2 | * | 10/2008 | Truche et al. ................. | 250/288 |
| 7,439,527 B2 | * | 10/2008 | Nakaya .................... | 250/492.21 |
| 7,649,633 B2 | * | 1/2010 | Kawate ........................ | 356/504 |
| 2005/0150451 A1 | * | 7/2005 | Tanaka et al. ................. | 118/688 |
| 2006/0192142 A1 | * | 8/2006 | Yamashita ................. | 250/492.1 |
| 2006/0289802 A1 | * | 12/2006 | Nakaya .................... | 250/492.21 |
| 2007/0297821 A1 | * | 12/2007 | Yamauchi et al. ............. | 399/52 |
| 2008/0105834 A1 | * | 5/2008 | Kim ........................ | 250/492.21 |
| 2008/0181752 A1 | * | 7/2008 | Takahashi et al. ....... | 414/222.02 |
| 2010/0261158 A1 | * | 10/2010 | Nordman et al. ................. | 435/6 |

FOREIGN PATENT DOCUMENTS

| JP | 10-38539 | | 2/1998 |
|---|---|---|---|
| JP | 10038539 A | * | 2/1998 |
| JP | 11-66930 | | 3/1999 |

* cited by examiner

*Primary Examiner* — Jack Berman
*Assistant Examiner* — Wyatt Stoffa
(74) *Attorney, Agent, or Firm* — Osha • Liang LLP

(57) ABSTRACT

An illuminating device includes: a light source which is disposed outside a vacuum chamber; a light guide which guides the light emitted from the light source, into the vacuum chamber; a light projecting portion which is fixed in the vacuum chamber, and which emits the light guided by the light guide; a light receiving portion which is attached to a support table of a holder driving device, and which receives the light emitted from the light projecting portion in a state where a holder is positioned in a notch detecting position; a light guide which guides the light received by the light receiving portion; and a light emitting device which is attached to the support table, and which irradiates an outer circumferential portion of a substrate with the light guided by the light guide.

4 Claims, 3 Drawing Sheets

ION IMPLANTING APPARATUS

This application claims priority from Japanese Patent Application No. 2008-258718, filed on Oct. 3, 2008, the entire contents of which are hereby incorporated by reference.

FIELD OF THE INVENTION

The present invention relates to an ion implanting apparatus for irradiating a substrate with an ion beam to perform ion implantation, and of the so-called mechanical scanning method in which a holder and a substrate held by the holder are mechanically scanned, and more specifically to an improvement of an illuminating device for detecting a notch position of a substrate held by a holder.

DESCRIPTION OF RELATED ART

In an ion implanting apparatus, JP-A-10-38539 discloses a technique in which an illuminating device irradiates an outer circumferential portion of a substrate (for example, a semiconductor wafer) held by a holder (this is also called a platen, the same shall apply hereinafter) disposed in a vacuum chamber, with light from a back face side of the substrate to form a silhouette (a shadow picture or an image in a shadow picture state, the same shall apply hereinafter) of the outer circumferential portion, an image of the silhouette is taken by a camera from a front face side of the substrate, and image data supplied from the camera are processed to detect a position of a notch disposed in the outer circumferential portion of the substrate. The reason why an image of the outer circumferential portion of the substrate is taken in a form of a silhouette is that a high contrast can be obtained and even a small notch is easily detected.

In the ion implanting apparatus, the holder and the substrate exist in a vacuum in the vacuum chamber. When an illuminating lamp configured by a Light Emitting Diode (LED) or the like is used as the illuminating device, therefore, there is a problem in that the illuminating lamp is broken by heat generated by it because heat conduction and convection by vapor do not occur in the vacuum.

In order to solve the problem, a technique may be employed in which light from a light source disposed outside the vacuum chamber is guided to a light emitting device in the vacuum chamber by using a light guide (for example, optical fibers), and the substrate is illuminated with the light supplied from the light source.

In this case, it is preferable that the light emitting device is disposed as near as possible to the holder and the substrate, because the illumination can be efficiently performed and an unwanted shadow can be prevented from being produced.

However, the ion implanting apparatus is an ion implanting apparatus of the so-called mechanical scanning method in which the holder and the substrate are mechanically scanned (in other words, reciprocally moved, the same shall apply hereinafter) in a direction (referred as the Y direction, and the direction is, for example, the vertical direction) which intersects the ion beam.

In the case of the ion implanting apparatus of the mechanical scanning method, also the light emitting device is scanned in the Y direction together with the holder to be reciprocally moved. The movement distance of the light emitting device (i.e., the scan distance of the holder) is longer, as a size of the substrate is larger. In the case where a diameter of the substrate is 300 mm, for example, the distance is about 400 mm. A scan frequency of the light emitting device is higher in accordance with a throughput of the apparatus or the like. For example, a high frequency of one time per 2 seconds is used at the maximum.

Therefore, a long light guide which corresponds to the movement distance of the light emitting device (the movement distance is considered) is necessary. Such a long light guide bends and stretches in accordance with the reciprocal movement of the light emitting device. As a result, a space for accommodating the light guide in the case where it bends must be ensured in the vacuum chamber, and hence the vacuum chamber and thus the ion implanting apparatus are increased in size.

When the long light guide repeatedly bends and stretches, the light guide may be contacted with the other structures such as the vacuum chamber, thereby particles (dusts) may be produced. In an ion implanting apparatus, as well known, the production of particles must be avoided as far as possible in order to perform clean ion implantation.

When the light guide repeatedly bends and stretches, stress is generated in the light guide, thereby it may be broken. Even when the light guide is not broken, the light transmittance may be lowered.

SUMMARY OF INVENTION

Illustrative aspects of the present invention provide an ion implanting apparatus of a mechanical scanning method in which a light guide which guides light from an outside of a vacuum chamber to a light emitting device constituting an illuminating device for detecting a position of a notch of a substrate is not caused to bend and stretch.

According to a first aspect of the invention, an ion implanting apparatus for irradiating a substrate held by a holder disposed in a vacuum chamber, with an ion beam to perform ion implantation, the apparatus includes: a holder driving device which mechanically scans the holder in a Y direction which intersects the ion beam; an illuminating device which irradiates an outer circumferential portion of the substrate held by the holder, with light from a back face side of the substrate, to form a silhouette of the outer circumferential portion; a camera which takes an image of the silhouette from a front face side of the substrate; and an image processing device which processes image data supplied from the camera to detect a position of a notch disposed in the outer circumferential portion of the substrate. The holder driving device includes a support table which supports the holder and which is driven only in the Y direction, and the holder driving device fixes a position of the support table in a state where the holder is positioned in a notch detecting position where the position of the notch of the substrate is detected. The illuminating device includes: a light source which is disposed outside the vacuum chamber, and which emits light; a first light guide which guides the light emitted from the light source, into the vacuum chamber; a light projecting portion which is fixed in the vacuum chamber, and which emits the light guided by the first light guide; a light receiving portion which is attached to the support table, and which receives the light emitted from the light projecting portion in a state where the holder is positioned in the notch detecting position; a second light guide which guides the light received by the light receiving portion; and a light emitting device which is attached to the support table, and which irradiates the outer circumferential portion of the substrate held by the holder, from the back face side of the substrate with the light guided by the second light guide, to form the silhouette of the outer circumferential portion.

Other aspects and advantages of the invention will be apparent from the following description, the drawings and the claims.

DETAILED DESCRIPTION OF EXEMPLARY EMBODIMENTS

Figure 1:
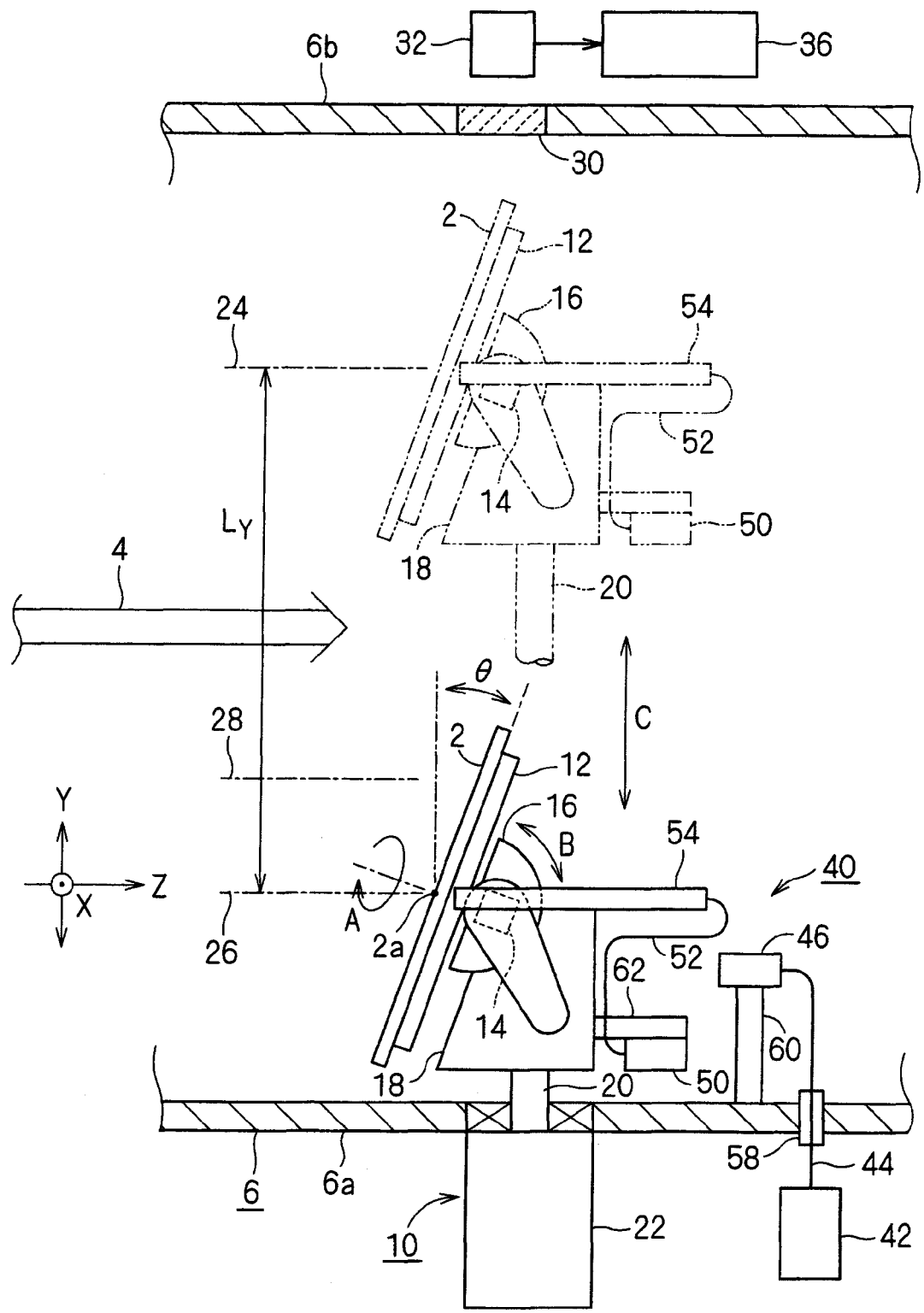
FIG. 1 is a side view showing an example of a state of ion implantation in an ion implanting apparatus of an exemplary embodiment of the invention.
Figure 2:
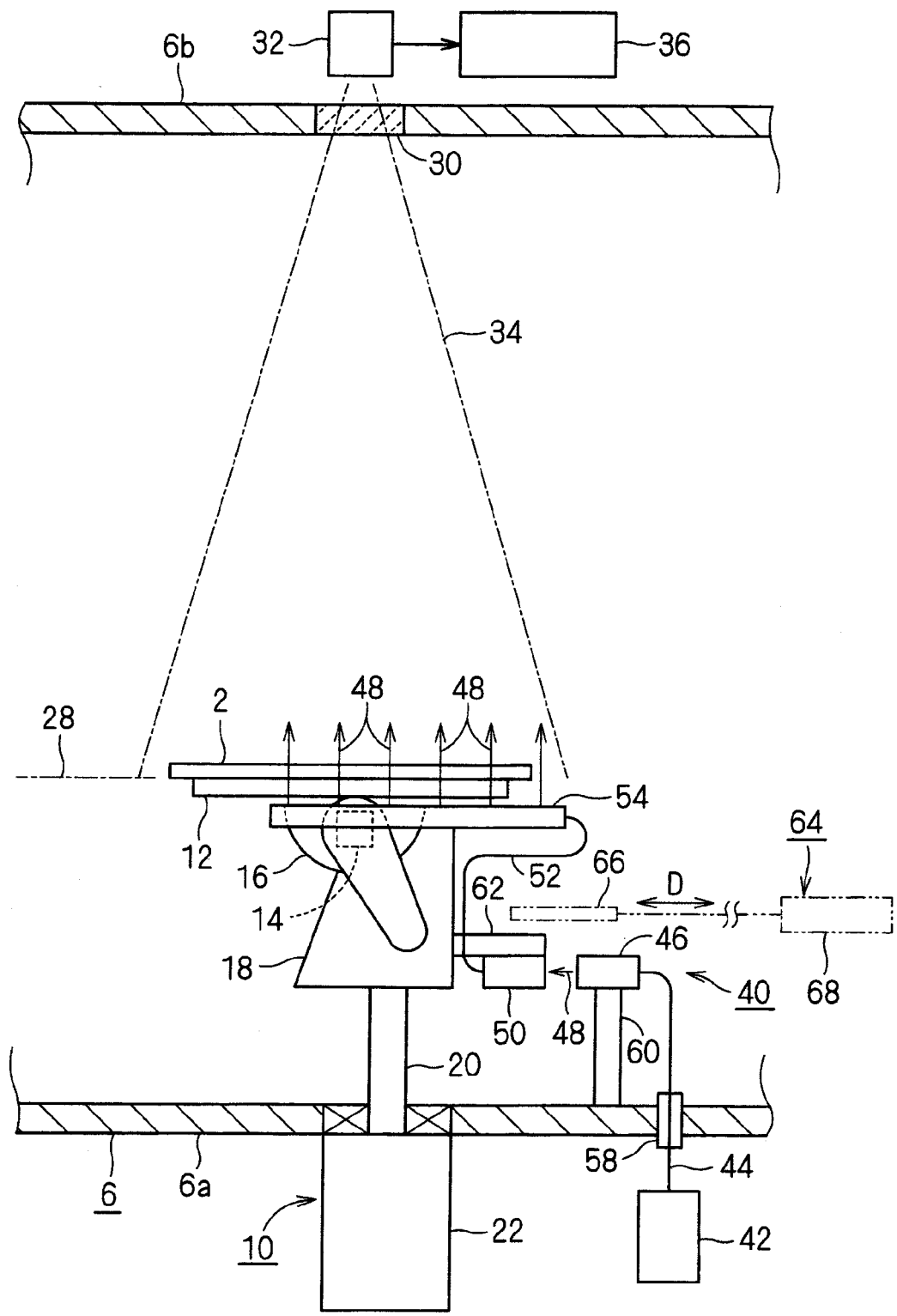
FIG. 2 is a side view showing an example of a state in detection of a notch position in the ion implanting apparatus of the exemplary embodiment of the invention.

FIG. 1 is a side view showing an example of a state of ion implantation in an ion implanting apparatus of an exemplary embodiment of the invention, and FIG. 2 is a side view showing an example of a state in detection of a notch position.

The ion implanting apparatus irradiates a substrate 2 held by a holder 12 disposed in a vacuum chamber 6 with an ion beam 4 to perform ion implantation.

Three directions which perpendicularly intersect one another at one point are set as X, Y, and Z directions, respectively. The ion beam 4 in the exemplary embodiment travels in the Z direction. In the exemplary embodiment, with or without performing an X-direction (for example, the horizontal direction) scan, the ion beam 4 has a ribbon-like shape in which the dimension in the X direction is larger than that in the Y direction (for example, the vertical direction). A face of the ion beam 4 in the XZ plane is referred to as a principal face.

Figure 3:
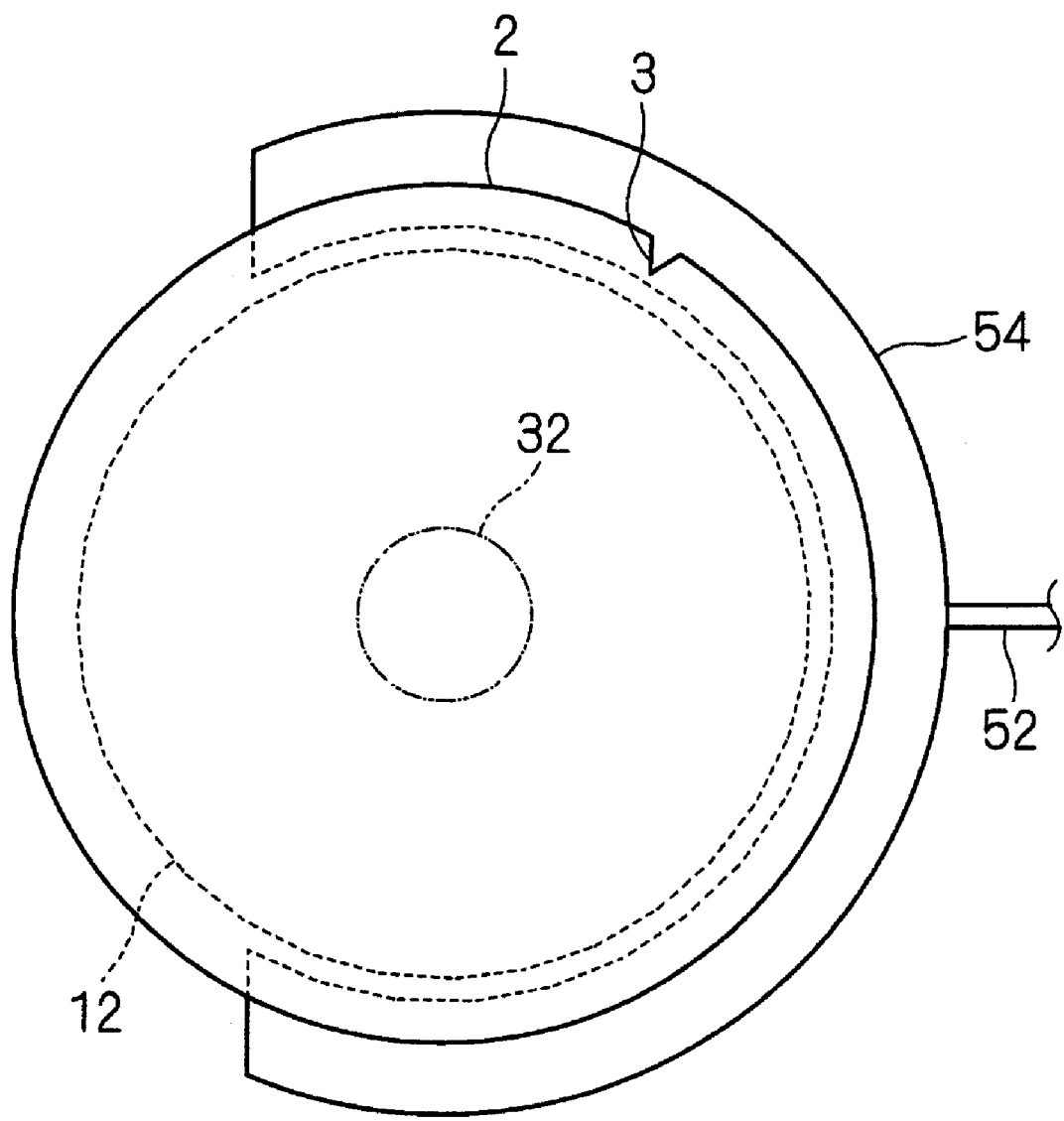
FIG. 3 is a plan view showing vicinities of a substrate, holder, and light emitting device in FIG. 2.

As in an example shown in FIG. 3, for example, the substrate 2 has a notch 3 in an outer circumferential portion. The shape of the notch 3 is not restricted to the illustrated example. For example, the substrate 2 is a semiconductor wafer, or may be any other kind of substrate such as a glass substrate as far as it has a notch. The substrate 2 is not restricted to an opaque one, and may be a substrate that can block light by the degree at which a silhouette is formed by light irradiation from the back face side of the substrate.

The ion implanting apparatus includes a holder driving device 10, an illuminating device 40, a camera 32, and an image processing device 36.

The holder driving device 10 has a function of, as indicated by the arrow C, mechanically scanning the holder 12 by a predetermined scan distance $L_Y$ in the Y direction which intersects the ion beam 4 (more specifically, the principal face of the ion beam), in a state where the substrate 2 is held by the holder. The reference numeral 24 denotes the upper end of the scan, and 26 denotes the lower end of the scan. Specifically, the holder driving device 10 has a scanning device 22 which performs the scan. The reference numeral 20 denotes a shaft of the scanning device 22. Namely, the ion implanting apparatus is an ion implanting apparatus of the mechanical scanning method.

In the exemplary embodiment, the holder driving device 10 further includes: a twist motor 14 which rotates the holder 12 together with the substrate 2 about a center portion 2a of the substrate 2 as indicated by the arrow A (or in the opposite direction of the arrow A); a tilt motor 16 which reciprocally rotates the holder 12 together with the substrate 2 and the twist motor 14 as indicated by the arrow B to swing the holder 12 and the substrate 2 between a raised state and a horizontal state, or change the tilt angle θ of the holder 12 and the substrate 2 with respect to the Y direction; and a support table 18 which supports the holder 12 and the like. The support table 18 is attached to an upper end portion of the shaft 20, and driven only in the Y direction by the scanning device 22.

The holder driving device 10 has another function of fixing the position (the position in the Y direction) of the support table 18 in a state where the holder 12 is positioned in a notch detecting position 28 where the position of the notch 3 (see FIG. 3) of the substrate 2 is detected. The notch detecting position 28 is within the scan distance $L_Y$. In the exemplary embodiment, as in the example shown in FIG. 2, the holder 12 is set to the horizontal state by the tilt motor 16, in the notch detecting position 28. In the exemplary embodiment, the detection of the position of the notch 3 in the substrate 2 is performed when the holder 12 and the substrate 2 in the notch detecting position 28 are in the horizontal state.

In the example shown in FIG. 2, the notch detecting position 28 is defined by the level of a surface of the holder 12. Alternatively, the position may be defined by the level of another portion of the holder 12. For example, the notch detecting position 28 is identical with the substrate handling level in which the substrate 2 is to be replaced with respect to the holder 12. However, the position is not restricted to the substrate handling level.

As in the example shown in FIG. 2, the illuminating device 40 irradiates the outer circumferential portion of the substrate 2 on the holder 12 which is in the horizontal state in the notch detecting position 28, from the back face side (rear face side) of the substrate 2 with light 48 to form a silhouette of the outer circumferential portion. The illuminating device 40 will be described later in detail.

In the exemplary embodiment, the camera 32 takes an image of the silhouette from the front face side (surface side) of the substrate 2 on the holder 12 which is in the horizontal state in the notch detecting position 28. More specifically, a transparent window plate 30 is disposed in a portion which is in a ceiling plane 6b of the vacuum chamber 6, and which is above the middle of the holder 12. The camera 32 is disposed near and outside the window plate 30. In the exemplary embodiment, a visual field of the camera 32 covers the whole substrate 2 which is in the horizontal state in the notch detecting position 28. However, it is not essential to cover the whole substrate 2, and the visual field may cover at least the outer circumferential portion in the angular range of an expected notch position.

The camera 32 is, for example, a CCD camera, but may be another kind of camera.

The image processing device 36 is disposed outside the vacuum chamber 6, and processes image data supplied from the camera 32 to detect the position of the notch 3 of the substrate 2. As the image processing device 36, for example, a known image processing device such as that disclosed in JP-A-10-38539 above may be used.

The illuminating device 40 will be described in detail. The illuminating device 40 includes: a light source 42 which is disposed outside the vacuum chamber 6, and which emits light; a first light guide 44 which guides the light emitted from the light source 42, into the vacuum chamber 6; and a light projecting portion 46 which is fixed in the vacuum chamber 6 (more specifically, in the bottom face 6a), and which emits the light 48 guided by the light guide 44.

As the light source 42, an LED may be used, or another kind of light source such as a lamp may be used. Each of the light guide 44 and a light guide 52 which will be described later is configured by using, for example, a plurality of optical fibers. A feed through 58 used as a vacuum window is disposed in a portion where the light guide 44 passes through the vacuum chamber 6. The light projecting portion 46 is fixed at a predetermined height by a supporting member 60.

The illuminating device 40 further includes: a light receiving portion 50 which is attached to the support table 18, and which is opposed to the light projecting portion 46 to receive the light 48 emitted from the light projecting portion 46 in the state where the support table 18 is fixed in the state where the holder 12 is positioned in the notch detecting position 28; the second light guide 52 which guides the light 48 received by the light receiving portion 50; and a light emitting device 54 which is attached to the support table 18, and which irradiates the outer circumferential portion of the substrate 2 held by the holder 12, from the back face side of the substrate 2 with the light 48 guided by the light guide 52, to form the silhouette. The light receiving portion 50 is attached to the support table 18 by a supporting member 62.

For example, the light emitting device 54 has a structure which is similar to an illuminating device disclosed in JP-A-11-66930. Namely, the light emitting device 54 is configured by a light guiding material such as transparent or approximately transparent glass or plastic. The light guide 52 is connected to the light emitting device 54. The light 48 guided by the light guide 52 is incident on the interior of the light emitting device 54, repeatedly reflected in the light emitting device 54, and then emitted from a substantially whole face of the light emitting device 54. In order to improve the efficiency of the upward emission of the light 48, the lower face of the light emitting device 54 may have a reflection plane which reflects the light 48 in an upward direction.

In order to efficiently irradiate the substrate 2 with the light 48 from the vicinity of the substrate 2, the light emitting device 54 is attached to an upper portion of the support table 18, and placed so as to be positioned in the vicinity of the rear face of the substrate 2 on the holder 12 which is in the horizontal state.

In order to detect the position of the notch 3, the light emitting device 54 is requested to irradiate the outer circumferential portion of the substrate 2 with the light 48. In the exemplary embodiment, as in the example shown in FIG. 3, therefore, the light emitting device 54 has a ring-like shape in which a part is cut away. The outer diameter of the light emitting device 54 is larger than the diameter of the substrate 2, and the inner diameter is smaller than the diameter of the substrate 2 and larger than the outer diameter of the holder 12. The configuration where a part is cut away is employed because, when the holder 12 and the substrate 2 are raised in the ion implantation as in the example shown in FIG. 3, they are prevented from hitting the light emitting device 54.

Usually, the position of the notch 3 of the substrate 2 placed on the holder 12 is within a certain angular range, and hence there arises no problem even when a part of the light emitting device 54 is cut away. Namely, it is not required to irradiate the whole outer circumferential portion of the substrate 2 with the light 48, and at least a part of the outer circumferential portion may be irradiated with the light 48. The angular range which is covered by the light emitting device 54 may be determined in consideration of, for example, the changing range of the notch position of the substrate 2 placed on the holder 12. For example, the angular range may be ⅓, ⅔, or ¾ of 360 degrees. In the case where the holder 12 is raised and made horizontal and the device covers 360 degrees, the light emitting device 54 and another illuminating device may be used in combination.

In the ion implanting apparatus, when the notch position of the substrate 2 is to be detected, the position of the support table 18 is fixed by the holder driving device 10 in the state where the holder 12 is positioned in the notch detecting position 28, and the light receiving portion 50 can receive the light 48 emitted from the light projecting portion 46, through a space. Even in the case where the light emitting device 54 is scanned in the Y direction together with the holder 12, when the notch position of the substrate 2 is to be detected, therefore, the light 48 supplied from the light source 42 disposed outside the vacuum chamber 6 can be guided to the light emitting device 54 through the first and second light guides 44, 52.

Moreover, the light guide is divided into the first light guide 44 on the side of the light source 42 (i.e., the fixation side), and the second light guide 52 on the side of the light emitting device 54 (i.e., the movable side). Even when the light emitting device 54 is scanned in the Y direction together with the holder 12, therefore, the light guides 44, 52 are not caused to bend and stretch.

The light receiving portion 50 and the light emitting device 54 are attached to the support table 18 which is driven only in the Y direction as described above, and also the holder 12 is supported by the same support table 18. Even in the case where the holder 12 is in any state, for example, in the case where the holder is scanned in the Y direction while being raised as shown in FIG. 1, or the case where the holder is in the horizontal state, the mutual positional relationship between the light receiving portion 50, the light guide 52 and the light emitting device 54 is unchanged, and hence the light guide 52 does not bend and stretch. The light guide 44 is not connected to a movable component, therefore the light guide 44 also does not bend and stretch.

As a result, even in the case where the scan distance $L_Y$ of the holder 12 is long, the lengths of the light guides 44, 52 can be made constant and minimum. Furthermore, a space for accommodating the light guides 44, 52 in the case where they bend is not required to be ensured in the vacuum chamber 6, and hence the vacuum chamber 6 and thus the ion implanting apparatus can be prevented from being increased in size. Recently, there is a tendency that the size of a substrate on which ion implantation is to be performed is increased, and hence also the scan distance $L_Y$ is correspondingly increased, and there is a further tendency that the substrate 2 is scanned at a higher frequency (higher cycle) in order to, for example, enhance the throughput. The above-mentioned effect that the lengths of the light guides 44, 52 can be made constant and minimum, and a below-described effect that the light guides 44, 52 are not caused to bend and stretch are great.

Even when the light emitting device 54 is scanned together with the holder 12, the light guides 44, 52 are not caused to bend and stretch. Therefore, it is possible to prevent the light guides 44, 52 from being contacted with the other structures such as the vacuum chamber 6 to cause particles to be produced. As a result, clean ion implantation is possible. Recently, the tendency that semiconductor devices formed in the surface of a semiconductor substrate by ion implantation are miniaturized is increasing, and the production of particles largely affects reduction of the yield of the semiconductor device production. Therefore, the above-described effect of preventing the production of particles from occurring is great.

Moreover, stress due to bending and stretching can be prevented from being generated in the light guides 44, 52. As a result, the life periods of the light guides 44, 52 can be prolonged. Usually, optical fibers are used as the light guides. Optical fibers are weak against stress due to bending and stretching. Therefore, the effect of preventing such stress from being generated is great.

In the case where a plurality of notch detecting positions 28 exist in the Y direction, at least one of the light projecting portion 46 and the light receiving portion 50 may be disposed in a plural number, and, at the plural positions, the light 48 emitted by the light projecting portion(s) 46 may be received by the light receiving portion(s) 50. The light guides 44, 52 may be shared by light projecting portions 46 and light receiving portions 50, respectively.

As in the example shown in FIG. 2, the apparatus further includes a shielding mechanism 64 which, when the notch position of the substrate 2 is to be detected, moves a shielding member 66 to hide a region between the light projecting portion 46 and the light receiving portion 50 by means of the shielding member 66 from the camera 32.

In the example, the shielding mechanism 64 has the movable shielding member 66, and a driving portion 68 which anteroposteriorly moves the shielding member 66 as indicated by the arrow D. When the notch position of the substrate 2 is to be detected, the shielding member 66 moves forward to hide the region between the light projecting portion 46 and the light receiving portion 50 by means of the shielding member 66 from the camera 32 (the state of FIG. 2), and, when ion implantation is to be performed, the shielding member 66 moves backward so that the shielding member 66 does not impede the Y-direction movement of the light receiving portion 50 and the like.

The disposition of the shielding mechanism 64 can prevent a situation where the light 48 leaking from the region between the light projecting portion 46 and the light receiving portion 50 enters the camera 32 to obscure the silhouette, from occurring.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. An ion implanting apparatus for irradiating a substrate held by a holder disposed in a vacuum chamber, with an ion beam to perform ion implantation, said apparatus comprising:
    a holder driving device which mechanically scans said holder in a Y direction which intersects the ion beam;
    an illuminating device which irradiates an outer circumferential portion of the substrate held by said holder, with light from a back face side of the substrate, to form a silhouette of the outer circumferential portion;
    a camera which takes an image of the silhouette from a front face side of the substrate; and
    an image processing device which processes image data supplied from said camera to detect a position of a notch disposed in the outer circumferential portion of the substrate,
wherein said holder driving device includes a support table which supports said holder and which is driven only in the Y direction, and said holder driving device fixes a position of said support table in a state where said holder is positioned in a notch detecting position where the position of the notch of the substrate is detected, and
wherein said illuminating device includes:
    a light source which is disposed outside said vacuum chamber, and which emits light;
    a first light guide which guides the light emitted from said light source, into said vacuum chamber;
    a light projecting portion which is fixed in said vacuum chamber, and which emits the light guided by said first light guide;
    a light receiving portion which is attached to said support table, and which receives the light emitted from said light projecting portion only in a state where said holder is positioned in the notch detecting position;
    a second light guide attached to the support plate which guides the light received by said light receiving portion; and
    a light emitting device which is attached to said support table, and which irradiates the outer circumferential portion of the substrate held by said holder, from the back face side of the substrate with the light guided by said second light guide, to form the silhouette of the outer circumferential portion.

2. The ion implanting apparatus according to claim 1, further comprising:
    a shielding mechanism which, when the position of the notch of the substrate is to be detected, moves a shielding member to cause the shielding member to hide a region between said light projecting portion and said light receiving portion from said camera.

3. The ion implanting apparatus according to claim 1, wherein a first end of the second light guide is connected to the light receiving portion and a second end of the second light guide is connected to the light emitting device.

4. The ion implanting apparatus according to claim 1, wherein the first and second light guides do not bend or stretch when the holder is moved in the Y direction.

* * * * *